US008368115B2

(12) United States Patent
Yoo

(10) Patent No.: US 8,368,115 B2
(45) Date of Patent: Feb. 5, 2013

(54) METHOD OF FABRICATING VERTICAL DEVICES USING A METAL SUPPORT FILM

(75) Inventor: Myung Cheol Yoo, Pleasanton, CA (US)

(73) Assignee: LG Electronics Inc., Seoul (KR)

( * ) Notice: Subject to any disclaimer, the term of this patent is extended or adjusted under 35 U.S.C. 154(b) by 87 days.

(21) Appl. No.: 11/497,268

(22) Filed: Aug. 2, 2006

(65) Prior Publication Data

US 2007/0018173 A1 Jan. 25, 2007

Related U.S. Application Data

(63) Continuation of application No. 10/118,317, filed on Apr. 9, 2002, now Pat. No. 8,294,172.

(51) Int. Cl.
*H01L 33/00* (2010.01)
(52) U.S. Cl. .......................................... 257/103; 257/79
(58) Field of Classification Search ............. 257/79–103
See application file for complete search history.

(56) References Cited

U.S. PATENT DOCUMENTS

| | | | |
|---|---|---|---|
| 3,602,982 A | 9/1971 | Kooi | |
| 4,141,135 A | 2/1979 | Henry et al. | |
| 4,406,052 A | 9/1983 | Cogan | |
| 5,034,068 A | 7/1991 | Glenn et al. | |
| 5,040,044 A | 8/1991 | Noguchi et al. | |
| 5,162,876 A | 11/1992 | Kitagawa et al. | |
| 5,504,036 A | 4/1996 | Dekker et al. | |
| 5,523,589 A | 6/1996 | Edmond et al. | |
| 5,592,501 A | 1/1997 | Edmond et al. | |
| 5,620,557 A | 4/1997 | Manabe et al. | |
| 5,631,664 A | 5/1997 | Adachi et al. | |
| 5,661,074 A | 8/1997 | Tischler | |
| 5,684,309 A | 11/1997 | McIntosh | |
| 5,707,745 A | 1/1998 | Forrest et al. | |
| 5,729,029 A | 3/1998 | Rudaz | |
| 5,739,554 A | 4/1998 | Edmong et al. | |

(Continued)

FOREIGN PATENT DOCUMENTS

| | | |
|---|---|---|
| DE | 100 22 879 A1 | 12/2000 |
| DE | 2009283 | 2/2001 |

(Continued)

OTHER PUBLICATIONS

Michael Kneissl, et al., "Continuous-Wave Operation of InGaN Multiple-Quantum-Well Laser Diodes on Copper Substrates Obtained by Laser Liftoff", IEEE Journal on Selected Topics in Quantum Electronics, vol. 7, No. 2, Mar./Apr. 2001.

(Continued)

*Primary Examiner* — Bradley K Smith
(74) *Attorney, Agent, or Firm* — McKenna Long & Aldridge LLP

(57) ABSTRACT

A method of fabricating semiconductor devices, such as GaN LEDs, on insulating substrates, such as sapphire. Semiconductor layers are produced on the insulating substrate using normal techniques. Trenches that define the boundaries of the individual devices are formed through the semiconductor layers and into the insulating substrate, beneficially by inductive coupled plasma reactive ion etching. A first support structure is attached to the semiconductor layers. The hard substrate is then removed, beneficially by laser lift off. A second supporting structure, preferably conductive, is substituted for the hard substrate and the first supporting structure is removed. Individual devices are then diced, beneficially by etching through the second supporting structure. A protective photo-resist layer can protect the semiconductor layers from the attachment of the first support structure. A conductive bottom contact (possibly reflective) can be inserted between the second supporting structure and the semiconductor layers.

25 Claims, 14 Drawing Sheets

U.S. PATENT DOCUMENTS

| | | | |
|---|---|---|---|
| 5,760,423 A | 6/1998 | Kamakura et al. | |
| 5,804,834 A | 9/1998 | Shimoyama et al. | |
| 5,929,466 A | 7/1999 | Ohba et al. | |
| 5,930,653 A | 7/1999 | Gaal | |
| 5,959,307 A | 9/1999 | Nakamura et al. | |
| 5,972,781 A | 10/1999 | Wegleiter | |
| 5,990,500 A | 11/1999 | Okazaki | |
| 6,008,507 A | 12/1999 | Lin et al. | |
| 6,025,251 A | 2/2000 | Jakowetz et al. | |
| 6,066,861 A | 5/2000 | Hohn et al. | |
| 6,067,309 A | 5/2000 | Onomura et al. | |
| 6,071,795 A | 6/2000 | Cheung et al. | |
| 6,078,064 A | 6/2000 | Ming-Jiunn et al. | |
| 6,096,570 A | 8/2000 | Hattori | |
| 6,100,104 A | 8/2000 | Haerle | |
| 6,100,545 A | 8/2000 | Chiyo et al. | |
| 6,120,600 A | 9/2000 | Edmond et al. | |
| 6,146,916 A | 11/2000 | Nanishi et al. | |
| 6,172,382 B1 | 1/2001 | Nagahama et al. | |
| 6,207,973 B1 | 3/2001 | Sato et al. | |
| 6,281,526 B1 | 8/2001 | Nitta et al. | |
| 6,303,405 B1 | 10/2001 | Yoshida et al. | |
| 6,320,206 B1 | 11/2001 | Coman et al. | |
| 6,326,294 B1 | 12/2001 | Jang et al. | |
| 6,329,216 B1 | 12/2001 | Matsumoto et al. | |
| 6,335,217 B1 | 1/2002 | Chiyo et al. | |
| 6,339,010 B2 | 1/2002 | Sameshima | |
| 6,350,998 B1 | 2/2002 | Tsuji | |
| 6,358,770 B2 | 3/2002 | Itoh et al. | |
| 6,365,429 B1 | 4/2002 | Kneissl et al. | |
| 6,395,572 B1 | 5/2002 | Tsutsui et al. | |
| 6,426,512 B1* | 7/2002 | Ito et al. | 257/12 |
| 6,455,340 B1 | 9/2002 | Chua et al. | |
| 6,479,839 B2 | 11/2002 | Nikolaev et al. | |
| 6,500,669 B2 | 12/2002 | Uemura et al. | |
| 6,510,195 B1 | 1/2003 | Chappo et al. | |
| 6,515,306 B2 | 2/2003 | Kuo et al. | |
| 6,518,079 B2 | 2/2003 | Imler | |
| 6,551,848 B2 | 4/2003 | Kwak et al. | |
| 6,555,405 B2 | 4/2003 | Chen et al. | |
| 6,562,648 B1 | 5/2003 | Wong et al. | |
| 6,586,875 B1 | 7/2003 | Chen et al. | |
| 6,589,808 B2 | 7/2003 | Chiyo et al. | |
| 6,614,060 B1 | 9/2003 | Wang et al. | |
| 6,624,491 B2 | 9/2003 | Waitl et al. | |
| 6,639,925 B2 | 10/2003 | Niwa et al. | |
| 6,677,173 B2 | 1/2004 | Ota | |
| 6,711,192 B1 | 3/2004 | Chikuma et al. | |
| 6,735,230 B1 | 5/2004 | Tanabe et al. | |
| 6,744,196 B1 | 6/2004 | Jeon | |
| 6,746,889 B1 | 6/2004 | Eliashevich et al. | |
| 6,765,232 B2 | 7/2004 | Takahashi et al. | |
| 6,784,463 B2 | 8/2004 | Camras et al. | |
| 6,803,603 B1 | 10/2004 | Nitta et al. | |
| 6,818,531 B1 | 11/2004 | Yoo et al. | |
| 6,846,686 B2 | 1/2005 | Saeki et al. | |
| 6,869,820 B2* | 3/2005 | Chen | 438/79 |
| 6,873,634 B2 | 3/2005 | Onomura et al. | |
| 6,876,003 B1 | 4/2005 | Nakamura et al. | |
| 6,876,005 B2 | 4/2005 | Hsieh et al. | |
| 6,949,395 B2 | 9/2005 | Yoo | |
| 6,960,488 B2 | 11/2005 | Brosnihan et al. | |
| 6,992,334 B1 | 1/2006 | Wierer et al. | |
| 7,067,849 B2 | 6/2006 | Yoo | |
| 7,125,737 B2 | 10/2006 | Edmond et al. | |
| 7,148,520 B2 | 12/2006 | Yoo | |
| 7,214,325 B2* | 5/2007 | Lee et al. | 216/13 |
| 7,250,638 B2 | 7/2007 | Lee et al. | |
| 7,371,597 B2 | 5/2008 | Yoo | |
| 7,402,838 B2* | 7/2008 | Tanizawa et al. | 257/94 |
| 7,816,705 B2* | 10/2010 | Lee et al. | 257/99 |
| 2001/0014391 A1 | 8/2001 | Forrest et al. | |
| 2001/0019134 A1 | 9/2001 | Chang et al. | |
| 2001/0042866 A1 | 11/2001 | Coman et al. | |
| 2002/0000643 A1* | 1/2002 | Uemura et al. | 257/639 |
| 2002/0123164 A1 | 9/2002 | Slater et al. | |
| 2002/0137244 A1 | 9/2002 | Chen et al. | |
| 2002/0139984 A1 | 10/2002 | Sugawara et al. | |
| 2002/0145147 A1 | 10/2002 | Chiou et al. | |
| 2002/0163302 A1 | 11/2002 | Nitta et al. | |
| 2002/0197856 A1 | 12/2002 | Matsuse et al. | |
| 2003/0077847 A1 | 4/2003 | Yoo | |
| 2003/0122144 A1 | 7/2003 | Uemura et al. | |
| 2004/0033638 A1 | 2/2004 | Bader | |
| 2004/0051105 A1 | 3/2004 | Tsuda et al. | |
| 2004/0259279 A1 | 12/2004 | Erchak et al. | |
| 2006/0027831 A1 | 2/2006 | Kioke et al. | |
| 2006/0060866 A1 | 3/2006 | Tezen | |
| 2006/0175681 A1 | 8/2006 | Li | |
| 2006/0289886 A1 | 12/2006 | Sakai | |
| 2007/0020790 A1 | 1/2007 | Erchak et al. | |
| 2007/0048885 A1 | 3/2007 | Jeon | |
| 2007/0122994 A1 | 5/2007 | Sonobe et al. | |
| 2008/0182420 A1 | 7/2008 | Hu et al. | |
| 2008/0236661 A1 | 10/2008 | Yao | |
| 2009/0072264 A1 | 3/2009 | Yoo | |
| 2009/0127567 A1 | 5/2009 | Wang | |

FOREIGN PATENT DOCUMENTS

| | | |
|---|---|---|
| DE | 19945007 | 3/2001 |
| DE | 10026255 | 11/2001 |
| EP | 1451853 | 9/2004 |
| JP | 63-178359 U | 11/1988 |
| JP | 9008403 A | 1/1997 |
| JP | 10177974 A | 6/1998 |
| JP | 10-303460 A | 11/1998 |
| JP | 11-135547 A | 5/1999 |
| JP | 11126923 A | 5/1999 |
| JP | 11-168236 A | 6/1999 |
| JP | 2000-164928 A | 6/2000 |
| JP | 2000196197 A | 7/2000 |
| JP | 2001-7399 A | 1/2001 |
| JP | 2001-250985 A | 9/2001 |
| JP | 2001244503 A | 9/2001 |
| JP | 2001-313422 A | 11/2001 |
| JP | 2001339100 | 12/2001 |
| JP | 2002076523 A | 3/2002 |
| KR | 10-2002-0000141 | 1/2002 |
| WO | WO 01/47038 A1 | 6/2001 |
| WO | WO 01/61804 A1 | 8/2001 |
| WO | WO 03/038874 | 5/2003 |

OTHER PUBLICATIONS

William S. Wong, et al., "Continuous-Wave InGaN Multiple-Quantum-Well Laser Diodes on Copper Substrates", Applied Physics Letters vol. 78, No. 9, Feb. 26, 2001.

William S. Wong, et al., "The integration of $in_xGa_{1-x}N$ Multiple-Quantum-Well Laser Diodes with Copper Substrates by Laser Lift-Off", Jpn. J. Appl. Phys. vol. 39 (2000) pp. L 1203-L 1205, Part 2, No. 12A, Dec. 1, 2000.

Wong et al, Integration of InGaN Laser Diodes with Dissimilar Substrates by Laser Lift-Off, 2001, Materials Research Society, pp. 12.2.1-12.2.5.

Stanley Wolf Ph.D., "Silicon Processing for the VLSI Era," vol. 2, Process Integration, 1990, Lattice Press, p. 193.

Schraud G., et al. , "Substrateless Singlemode Vertical Cavity Surface-Emitting GaAs/GaAlAs Laser Diode", Electronics Letters, IEE, Feb. 3, 1994, vol. 30, No. 3, pp. 238-239.

\* cited by examiner

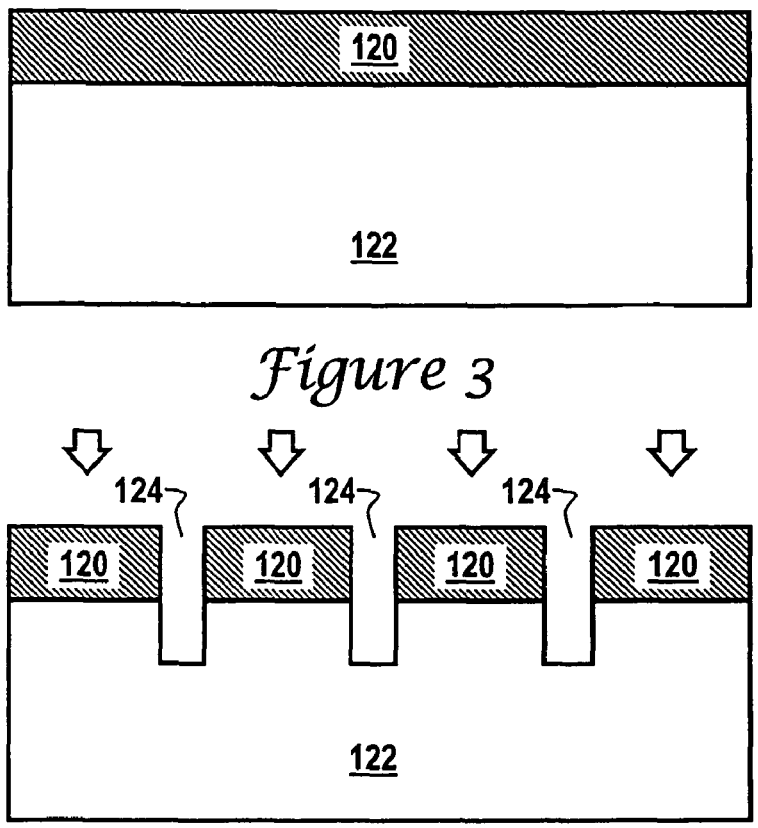
Figure 3
Figure 4
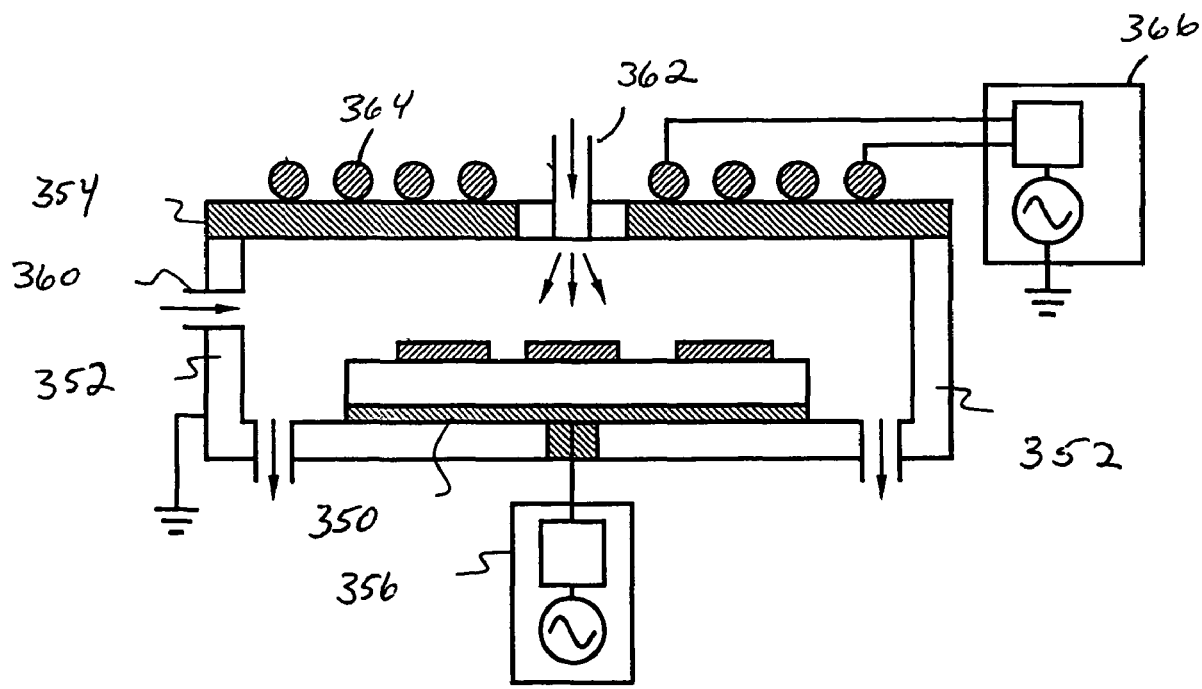
Figure 5

192 - metal contact
190 - transparent contact

METHOD OF FABRICATING VERTICAL DEVICES USING A METAL SUPPORT FILM

This application is a continuation of U.S. patent application Ser. No. 10/118,317, filed Apr. 9, 2002 now U.S. Pat. No. 8,294,172, which is hereby incorporated by reference.

BACKGROUND OF THE INVENTION

1. Field of the Invention

The present invention relates to semiconductor device fabrication. More particularly, the present invention relates to a method of fabricating vertical devices using a metal support film.

2. Discussion of the Related Art

Light emitting diodes ("LEDs") are well-known semiconductor devices that convert current into light. The color of the light (wavelength) that is emitted by an LED depends on the semiconductor material that is used to fabricate the LED. This is because the wavelength of the emitted light depends on the semiconductor material's band-gap energy, which represents the energy difference between valence band and conduction band electrons.

Gallium-Nitride (GaN) has gained much attention from LED researchers. One reason for this is that GaN can be combined with indium to produce InGaN/GaN semiconductor layers that emit green, blue, and white visible light. This wavelength control ability enables an LED semiconductor designer to tailor material characteristics to achieve beneficial device characteristics. For example, GaN enables an LED semiconductor designer to produce blue LEDs and blue laser diodes, which are beneficial in full color displays and in optical recordings, and white LEDs, which can replace incandescent lamps.

Because of the foregoing and other advantageous, the market for GaN-based LEDs is rapidly growing. Accordingly, GaN-based opto-electronic device technology has rapidly evolved since their commercial introduction in 1994. Because the efficiency of GaN light emitting diodes has surpassed that of incandescent lighting, and is now comparable with that of fluorescent lighting, the market for GaN based LEDs is expected to continue its rapid growth.

Despite the rapid development of GaN device technology, GaN devices are too expensive for many applications. One reason for this is the high cost of manufacturing GaN-based devices, which in turn is related to the difficulties of growing GaN epitaxial layers and of subsequently dicing out completed GaN-based devices.

GaN-based devices are typically fabricated on sapphire substrates. This is because sapphire wafers are commercially available in dimensions that are suitable for mass-producing GaN-based devices, because sapphire supports high-quality GaN epitaxial layer growths, and because of the extensive temperature handling capability of sapphire. Typically, GaN-based devices are fabricated on 2" diameter sapphire wafers that are either 330 or 430 microns thick. Such a diameter enables the fabrication of thousands of individual devices, while the thickness is sufficient to support device fabrication without excessive wafer warping. Furthermore, the sapphire crystal is chemically and thermally stable, has a high melting temperature that enables high temperature fabrication processes, has a high bonding energy (122.4 Kcal/mole), and a high dielectric constant. Chemically, sapphires are crystalline aluminum oxide, $Al_2O_3$.

Fabricating semiconductor devices on sapphire is typically performed by growing an n-GaN epitaxial layer on a sapphire substrate using metal oxide chemical vapor deposition (MOCVD) or molecular beam epitaxy (MBE). Then, a plurality of individual devices, such as GaN LEDs, is fabricated on the epitaxial layer using normal semiconductor processing techniques. After the individual devices are fabricated they must be diced out of the sapphire substrate. However, since sapphires are extremely hard, are chemically resistant, and do not have natural cleave angles, sapphire substrates are difficult to dice. Indeed, dicing typically requires that the sapphire substrate be thinned to about 100 microns by mechanical grinding, lapping, and/or polishing. It should be noted that such mechanical steps are time consuming and expensive, and that such steps reduce device yields. Even after thinning sapphires remain difficult to dice. Thus, after thinning and polishing, the sapphire substrate is usually attached to a supporting tape. Then, a diamond saw or stylus forms scribe lines between the individual devices. Such scribing typically requires at least half an hour to process one substrate, adding even more to the manufacturing costs. Additionally, since the scribe lines have to be relatively wide to enable subsequent dicing, the device yields are reduced, adding even more to manufacturing costs. After scribing, the sapphire substrates are rolled using a rubber roller to produce stress cracks that propagate from the scribe lines and that subsequently dice out the individual semiconductor devices. This mechanical handling reduces yields even more.

In addition to the foregoing problem of dicing individual devices from sapphire substrates, or in general other insulating substrate, sapphire substrates or other insulating substrate have other drawbacks. Of note, because sapphire is an insulator, the device topologies that are available when using sapphire substrates (or other insulating substrates) are limited. In practice there are only two device topologies: lateral and vertical. In the lateral topology the metallic electrical contacts that are used to inject current are both located on upper surfaces. In the vertical topology the substrate is removed, one metallic contact is on the upper surface and the other contact is on the lower surface.

FIGS. 1A and 1B illustrate a typical lateral GaN-based LED 20 that is fabricated on a sapphire substrate 22. Referring now specifically to FIG. 1A, an n-GaN buffer layer 24 is formed on the substrate 22. A relatively thick n-GaN layer 26 is formed on the buffer layer 24. An active layer 28 having multiple quantum wells of aluminum-indium-gallium-nitride (AlInGaN) or of InGaN/GaN is then formed on the n-type GaN layer 26. A p-GaN layer 30 is then formed on the active layer 26. A transparent conductive layer 32 is then formed on the p-GaN layer 30. The transparent conductive layer 32 may be made of any suitable material, such as Ru/Au, Ni/Au or indium-tin-oxide (ITO). A p-type electrode 34 is then formed on one side of the transparent conductive layer 32. Suitable p-type electrode materials include Ni/Au, Pd/Au, Pd/Ni and Pt. A pad 36 is then formed on the p-type electrode 34. Beneficially, the pad 36 is Au. The transparent conductive layer 32, the p-GaN layer 30, the active layer 28 and part of the n-GaN layer 26 are etched to form a step. Because of the difficulty of wet etching GaN, a dry etch is usually used to form the step. This etching requires additional lithography and stripping processes. Furthermore, plasma damage to the GaN step surface is often sustained during the dry-etch process. The LED 20 is completed by forming an n-electrode pad 38 (usually Au) and pad 40 on the step.

FIG. 1B illustrates a top down view of the LED 20. As can be seen, lateral GaN-based LEDs have a significant draw back in that having both metal contacts (36 and 40) on the same side of the LED significantly reduces the surface area available for light emission. As shown in FIG. 1B the metal contacts 36 and 40 are physically close together. Furthermore, as previously mentioned the pads 36 are often Au. When external wire bonds are attached to the pads 36 and 40 the Au often spreads. Au spreading can bring the electrical contacts even closer together. Such closely spaced electrodes 34 are highly susceptible to ESD problems.

FIGS. 2A and 2B illustrate a vertical GaN-based LED 50 that was formed on a sapphire substrate that was later removed. Referring now specifically to FIG. 2A, the LED 50 includes a GaN buffer layer 54 having an n-metal contact 56 on a bottom side and a relatively thick n-GaN layer 58 on the other. The n-metal contact 56 is beneficially formed from a high reflectively layer that is overlaid by a high conductivity metal (beneficially Au). An active layer 60 having multiple quantum wells is formed on the n-type GaN layer 58, and a p-GaN layer 62 is formed on the active layer 60. A transparent conductive layer 64 is then formed on the p-GaN layer 62, and a p-type electrode 66 is formed on the transparent conductive layer 64. A pad 68 is formed on the p-type electrode 66. The materials for the various layers are similar to those used in the lateral LED 20. The vertical GaN-based LED 50 as the advantage that etching a step is not required. However, to locate the n-metal contact 56 below the GaN buffer layer 54 the sapphire substrate (not shown) has to be removed. Such removal can be difficult, particularly if device yields are of concern. However, as discussed subsequently, sapphire substrate removal using laser lift off is known. (see, U.S. Pat. No. 6,071,795 to Cheung et al., entitled, "Separation of Thin Films From Transparent Substrates By Selective Optical Processing," issued on Jun. 6, 2000, and Kelly et al. "Optical process for liftoff of group III-nitride films", Physica Status Solidi (a) vol. 159, 1997, pp. R3-R4).

Referring now to FIG. 2B, vertical GaN-based LEDs have the advantage that only one metal contact (68) blocks light emission. Thus, to provide the same amount of light emission area lateral GaN-based LEDs must have larger surface areas, which causes lower device yields. Furthermore, the reflecting layer of the n-type contact 56 used in vertical GaN-based LEDs reflect light that is otherwise absorbed in lateral GaN-based LEDs. Thus, to emit the same amount of light as a vertical GaN-based LED, a lateral GaN-based LED must have a significantly larger surface area. Because of these issues, a 2" diameter sapphire wafer can produce about 35,000 vertical GaN-based LEDs, but only about 12,000 lateral GaN-based LEDs. Furthermore, the lateral topology is more vulnerable to static electricity, primarily because the two electrodes (36 and 40) are so close together. Additionally, as the lateral topology is fabricated on an insulating substrate, and as the vertical topology can be attached to a heat sink, the lateral topology has relatively poor thermal dissipation. Thus, in many respects the vertical topology is operationally superior to the lateral topology.

However, most GaN-based LEDs fabricated on insulating substrates have a lateral topology. This is primarily because of the difficulties of removing the insulating substrate and of handling the GaN wafer structure without a supporting substrate. Despite these problems, removal of an insulating (growth) substrate and subsequent wafer bonding of the resulting GaN-based wafer on a Si substrate using Pd/In metal layers has been demonstrated for very small area wafers, approx. 1 cm by 1 cm. (reported by the University of California at Berkley and the Xerox Corporation). But, substrate removal and subsequent wafer bonding of large area wafers remains very difficult due to inhomogeneous bonding between the GaN wafer and the $2^{nd}$ (substitutional) substrate. This is mainly due to wafer bowing during and after laser lift off.

Thus, it is apparent that a better method of substituting a $2^{nd}$ (substitutional) substrate for the original (growth) insulating substrate would be beneficial. In particular, a method that provides for mechanical stability of the wafer, that supports good electrical contact, and that assists heat dissipation would be highly useful, particularly for devices subject to high electrical current injection, such as laser diodes or high power LEDs. This would enable forming semiconductor layers on an insulating substrate, followed by removal of the insulating substrate to isolate a wafer having the formed semiconductor layers, followed by subsequent attachment of the wafer to a metal substitutional substrate. Of particular benefit would be a new method suitable for removing sapphire substrates from partially fabricated semiconductor devices, particularly if those devices are GaN-based. For example, a method of removing semiconductor layers from a sapphire substrate, of isolating a wafer having the partially fabricated semiconductor devices such that wafer warping is reduced or prevented, followed by substitution of a metal supporting layer would be useful. More specifically, a method of partially fabricating GaN-based devices on a sapphire (or other insulating) substrate, followed by substitution of a conducting supporting layer, followed by dicing the substituting layer to yield vertical topology GaN-based LEDs would be beneficial.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole The principles of the present invention provide for a method of fabricating semiconductor devices on insulating substrates by first forming semiconductor layers on the insulating substrate; followed by removal of the insulating substrate to isolate a wafer having the formed semiconductor layers, followed by the addition of a metal support substrate (either on top or bottom of semiconductor layers) that will support the wafer, all while supporting the wafer to prevent warping and/or other damage.

The principles of the present invention further provide for a method of fabricating GaN-based vertical devices on insulating substrates using metal support films. According to that method, semiconductor layers for the GaN-based devices are formed on an insulating (sapphire) substrate using normal semiconductor fabrication techniques. Then, trenches are formed through the semiconductor layers and into the insulating substrate. Beneficially, the trenches are fabricated using inductive couple (inductively coupled) plasma reactive ion etching (ICPRIE). Then, a first support structure is attached to the semiconductor layers. Beneficially, the first support structure is comprised of silicon, but almost any hard flat surface is acceptable. That first support structure is beneficially attached to the semiconductive layers using an epoxy adhesive, possibly with a protective photo-resist layer over the semiconductive layer. Then, the insulating substrate is removed, beneficially using a laser-lift off process. A second supporting structure is then substituted for the insulating substrate. Beneficially, the second supporting structure is comprised of a metal film of Cu, Au or Al, but almost any conductive film is acceptable. If required, a conductive contact can be inserted between the semiconductive layer and the second supporting structure. In the case of LEDs, the conductive contact is beneficially reflective to bounce photons upward to prevent absorption in the bottom lead frame. The first supporting structure is then removed. Individual devices are then diced out, beneficially either by mechanical dicing or wet/dry etching through the second supporting structure.

The following describes another way of forming metal support films on the semiconductor layers. Trench formation through the semiconductor layers and into the insulating substrate is identical to the procedure described above. Then, instead of attaching the semiconductor layers onto the support structure (Si or a hard flat surface), a thick metal support film is deposited on top of the GaN-based devices using chemical and/or physical deposition techniques (such as electroplating or electro-less plating). Then, the insulating substrate is removed, beneficially using a laser-lift off process. Beneficially, the thick metal support film is comprised of Cu, Au or Al, but almost any conductive film is acceptable. If required, a conductive contact can be inserted between the semiconductive layer and the second supporting structure. In the case of LEDs, the conductive contact is beneficially reflective to bounce photons to prevent absorption in the bottom lead frame. Electrical contacts can then be formed on the exposed surface of the semiconductor layers. Individual devices can then diced out, beneficially either by mechanical dicing or wet/dry etching through the thick metal support film.

The principles of the present invention specifically provide for a method of fabricating vertical topology GaN-based LEDs on sapphire substrates. According to that method, semiconductor layers for the vertical topology GaN-based LEDs are formed on a sapphire substrate using normal semiconductor fabrication techniques. Then, trenches are formed through the semiconductor layers and into the sapphire substrate. Those trenches define the boundaries of the individual vertical topology GaN-based LEDs. Beneficially, the trenches are fabricated using ICPRIE. Then, a protective photo-resist layer is located over the semiconductor layers. A first support structure is then attached to the semiconductor layers. Beneficially, the first support structure is a silicon plate, but almost any hard flat material is acceptable. The first support structure is beneficially attached to the semiconductive layers (or photo-resist layer) using an epoxy adhesive. Then, the sapphire substrate is removed, beneficially using a laser lift off process. A conductive bottom contact is then located on the exposed semiconductor layer. That conductive bottom contact beneficially includes a reflective layer. One or more adhesion support layers, such as a Cr and/or and Au layer, is formed over the reflective layer. Then, a second supporting structure is substituted in place of the sapphire substrate. Beneficially, the second supporting structure is comprised of a conductive film of Cu, Au or Al, but almost any conductive film is acceptable. The first supporting structure is then removed. Finally, the individual device dies are diced out, beneficially either by mechanical dicing or by wet/dry etching through the second supporting structure. Mechanical rolling or shear cutting can be used to separate the dies.

The principles of the present invention also provide for another method of fabricating vertical topology GaN-based LEDs on sapphire substrates. According to that method, semiconductor layers for the vertical topology GaN-based LEDs are formed on a sapphire substrate using normal semiconductor fabrication techniques. Then, trenches are formed through the semiconductor layers and into the sapphire substrate. Those trenches define the boundaries of the individual vertical topology GaN-based LEDs. Beneficially, the trenches are fabricated using ICPRIE. Then, a contact layer comprised, for example, of layers of Cr and Au is located over the semiconductor layers. Then a metal support structure is then formed over the contact layer/semiconductor layers. Then, the sapphire substrate is removed, beneficially using a laser lift off process. Conductive bottom contacts are then located on the recently exposed semiconductor layer. Finally, the individual device dies are diced out, beneficially either by mechanical dicing or by wet/dry etching through the metal support structure.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

In the drawings:

FIGS. 3-25 illustrate steps of forming light emitting diodes that are in accord with the principles of the present invention.

DETAILED DESCRIPTION OF THE INVENTION

The principles of the present invention provide for methods of fabricating GaN-based vertical devices on insulating substrates using thick metal support films. While those principles are illustrated in a detailed description of a method of fabricating vertical topology GaN-based LEDs on a sapphire substrate, those principles are broader than that method. Therefore, the principles of the present invention are to be limited only by the appended claims as understood under United States Patent Laws.

FIGS. 3-25 illustrate methods of manufacturing vertical topology GaN-based light emitting diodes (LEDs) using sapphire substrates. Sapphire substrates are readily available in suitable sizes, are thermally, chemically, and mechanically stable, are relatively inexpensive, and support the growth of good quality GaN epitaxial layers.

Figure 1A:
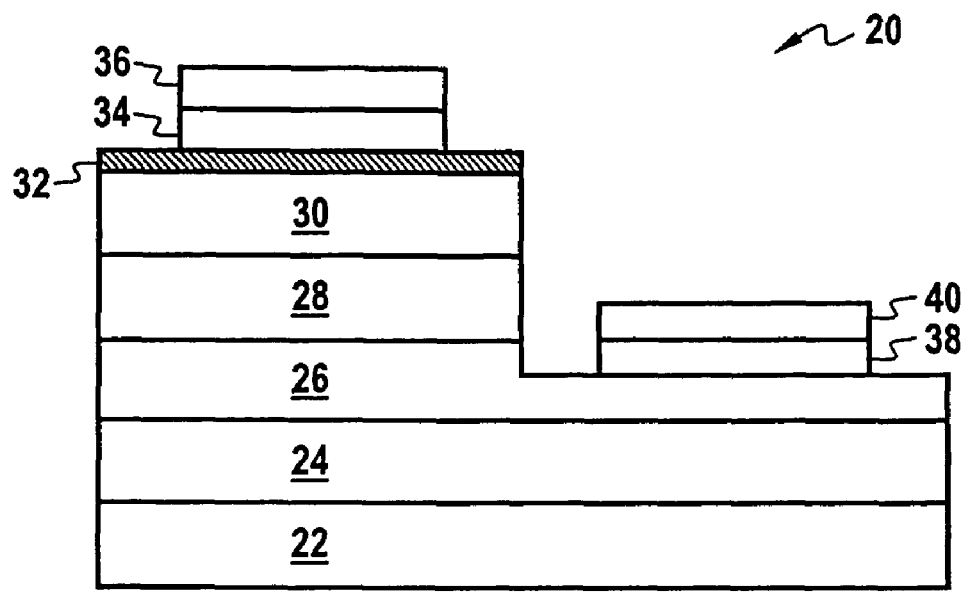
FIG. 1A illustrates a sectional view of a typical lateral topology GaN-based LED.
Figure 1B:
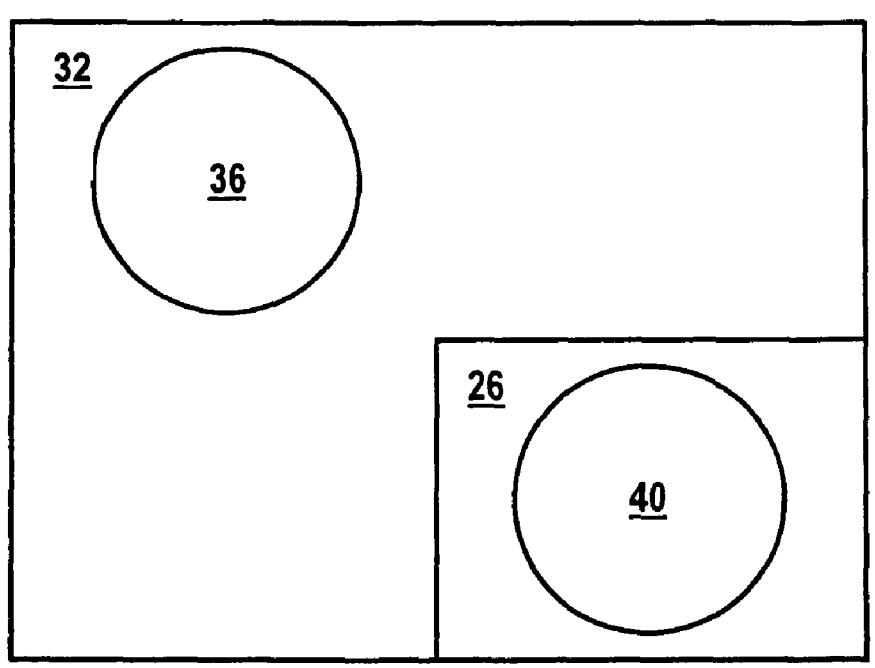
FIG. 1B shows a top down view of the GaN-based LED illustrated in FIG. 1A.
Figure 2A:
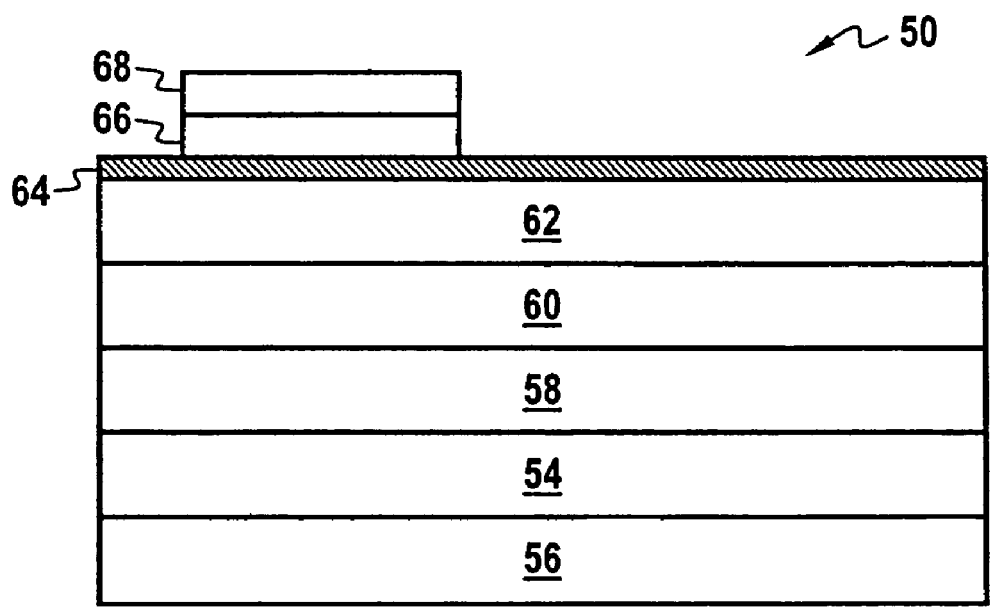
FIG. 2A illustrates a sectional view of a typical vertical topology GaN-based LED.
Figure 2B:
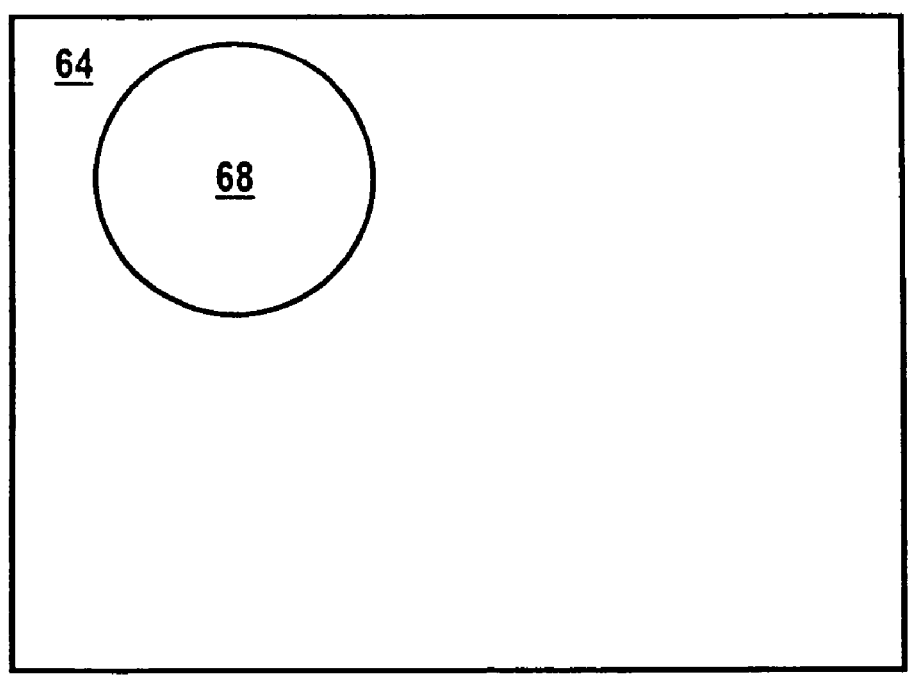
FIG. 2B shows a top down view of the GaN-based LED illustrated in FIG. 2A.

Referring now to FIG. 3, a vertical topology GaN-based LED layer structure 120 that is similar or identical to the semiconductor layers of the vertical GaN-based LED 50 illustrated in FIGS. 2A and 2B is formed on a 330-430 micron-thick, 2" diameter sapphire substrate 122. For example, the vertical topology GaN-based LED layer structure 120 can have an InGaN/GaN active layer (60) having the proper composition to emit blue light. The vertical topology GaN-based LED layer structure 120 is beneficially less than 5 microns thick. Various standard epitaxial growth techniques, such as vapor phase epitaxy, MOCVD, and MBE, together with suitable dopants and other materials, can be used to produce the vertical topology GaN-based LED layer structure 120.

Referring now to FIG. 4, trenches 124 are formed through the vertical topology GaN-based LED layer structure 120 and into the sapphire substrate 122. The trenches define the individual LED semiconductor structures that will be produced and separated. Each individual LED semiconductor structure is beneficially a square about 200 microns wide. The trenches are beneficially narrower than about 10 microns wide and extend deeper than about 5 microns into the sapphire substrate 122.

Because of the hardness of sapphire and GaN, the trenches 124 are beneficially formed in the structure of FIG. 3 using reactive ion etching, preferably inductively coupled plasma reactive ion etching (ICP RIE). Forming trenches using ICP RIE has two main steps: forming scribe lines and etching. Scribe lines are formed on the structure of FIG. 3 using a photo-resist pattern in which areas of the sapphire substrate 122 where the trenches 124 are to be formed are exposed. The exposed areas are the scribe lines and all other areas are covered by photo-resist. The photo-resist pattern is beneficially fabricated from a relatively hard photo-resist material that withstands intense plasma. For example, the photo-resist could be AZ 9260, while the developer used to develop the photo-resist to form the scribe lines could be AZ MIF 500.

In the illustrated example, the photo-resist is beneficially spin coated to a thickness, of about 10 microns. However, in general, the photo-resist thickness should be about the same as the thickness of the vertical topology GaN-based LED layer structure 120 plus the etch depth into the sapphire substrate 122. This helps ensure that the photo-resist mask remains intact during etching. Because it is difficult to form a thick photo-resist coating in one step, the photo-resist is beneficially applied in two coats, each about 5 microns thick. The first photo-resist coat is spin coated on and then soft baked at approximately 90° F. for about 15 minutes. Then, the second photo-resist coat is applied in a similar manner, but is soft baked at approximately 110° C. for about 8 minutes. The photo-resist coating is then patterned to form the scribe lines. This is beneficially performed using lithographic techniques and development. Development takes a relatively long time because of the thickness of the photo-resist coating. After development, the photo-resist pattern is hard baked at about 80° F. for about 30 minutes. Then, the hard baked photo-resist is beneficially dipped in a MCB (Metal Chlorobenzene) treatment for about 3.5 minutes. Such dipping further hardens the photo-resist.

After the scribe lines are defined, the structure of FIG. 3 is etched. Referring now to FIG. 5, the ICP RIE etch process is performed by placing the structure of FIG. 3 on a bottom electrode 350 in a RIE chamber 352 having an insulating window 354 (beneficially a 1 cm-thick quartz window). The bottom electrode 350 is connected to a bias voltage supply 356 that biases the structure of FIG. 3 to enable etching. The bias voltage supply 356 beneficially supplies 13.56 MHz RF power and a DC-bias voltage. The distance from the insulating window 354 to the bottom electrode 350 is beneficially about 6.5 cm. A gas mixture of $Cl_2$ and $BCl_3$, and possibly Ar, is injected into the RIE chamber 352 through a reactive gas port 360. Furthermore, electrons are injected into the chamber via a port 362. A 2.5-turn or so spiral Cu coil 364 is located above the insulating window 354. Radio frequency (RF) power at 13.56 MHz is applied to the coil 364 from an RF source 366. It should be noted that magnetic fields are produced at right angles to the insulating window 354 by the RF power.

Still referring to FIG. 5, electrons present in the electromagnetic field produced by the coil 364 collide with neutral particles of the injected gases, resulting in the formation of ions and neutrals, which produce plasma. Ions in the plasma are accelerated toward the structure of FIG. 3 by the bias voltage applied by the bias voltage supply 356 to the bottom electrode 350. The accelerated ions pass through the scribe lines, forming the etch channels 124 (see FIG. 4).

With the structure of FIG. 4, fabrication proceeds using one of two general procedures. The first procedure is to form a temporary substrate on top of the structure of FIG. 4. The other is to form a permanent metal layer on top of the structure of FIG. 4. The formation of a temporary substrate will be described first (with reference to FIGS. 6 through 15), followed by a description of the use of a permanent metal layer (with reference to FIGS. 16-20).

Figure 6:
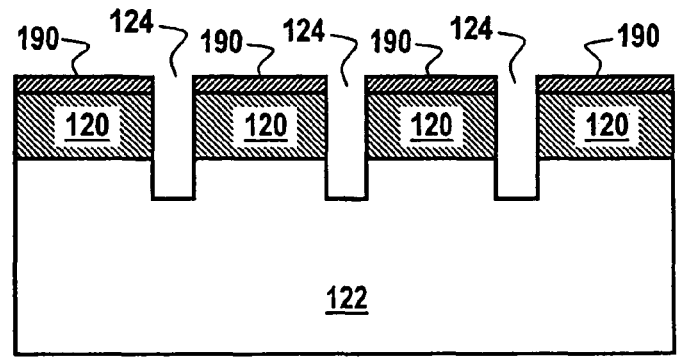
Figure 7:
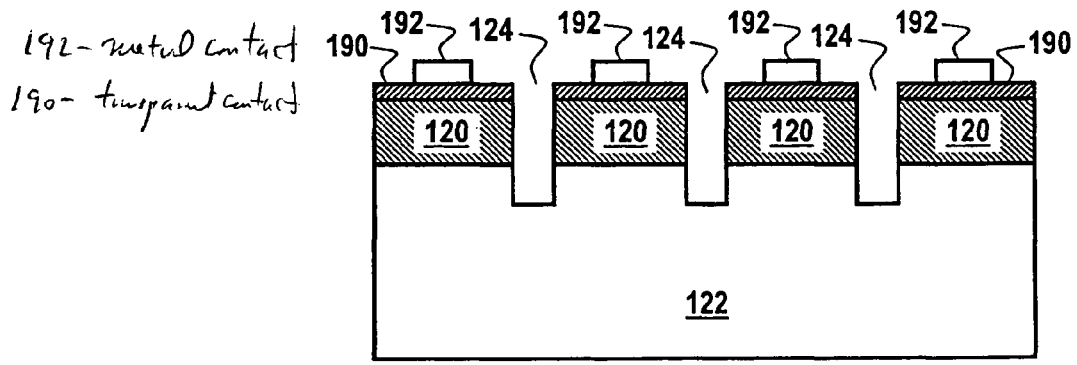

Referring now to FIG. 6, after the trenches 124 are formed, thin transparent contacts 190 are formed on the individual LED semiconductor structures of the vertical topology GaN-based LED layer structure 120. Those transparent contacts 190 are beneficially comprised of Ru/Au, Ni/Au, or of indium tin oxide (ITO)/Au and are less than 10 μm. As shown in FIG. 7, after the transparent contacts 190 are formed, metal contact pads 192 are placed on each transparent contact 190. The metal contact pads 192 are beneficially comprised of Pd, Pt, Au, or Al. Each metal contact pad 192 has a diameter of about 100 microns and a thickness of about 1 micron. A thin Cr/Au inter layer can be used to improve adhesion between transparent contacts 190 and the metal contact pad 192.

Figure 8:
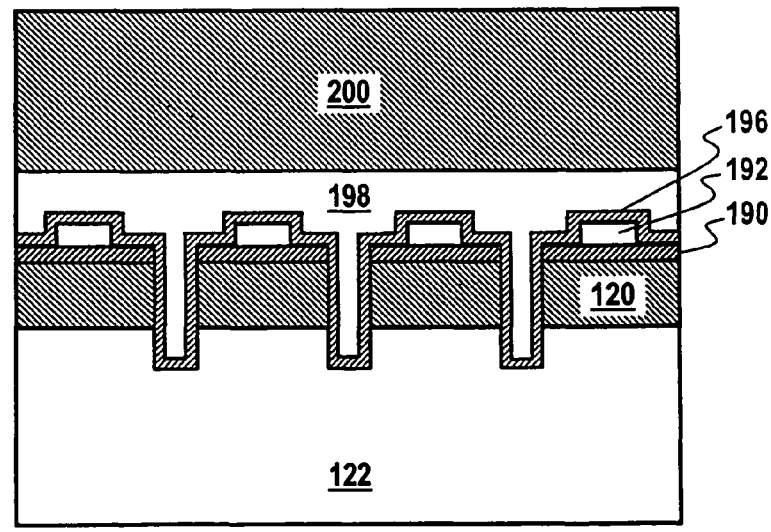

Referring now to FIG. 8, a protective photo-resist film 196 is formed over the structure of FIG. 7. That photo-resist film is to protect the GaN-based LED layer structure 120 and to assist subsequent bonding. An epoxy adhesive 198 is then used to attach a first supporting structure that takes the form of a temporary supporting wafer 200. The temporary supporting wafer 200 is beneficially a silicon plate that is larger than the sapphire wafer. However, almost any hard, flat surface with a sufficient thickness to support a wafer containing the individual LED semiconductor devices during substrate swapping (described subsequently) is acceptable. Still referring to FIG. 8, the first substrate swapping processes is surface polishing and sand blasting (or surface roughening with a dry etching processes) the backside (the bottom side in FIG. 8) of the sapphire substrate 122. This step helps to ensure uniform laser beam heating during a laser lift off step that is subsequently performed.

Figure 9:
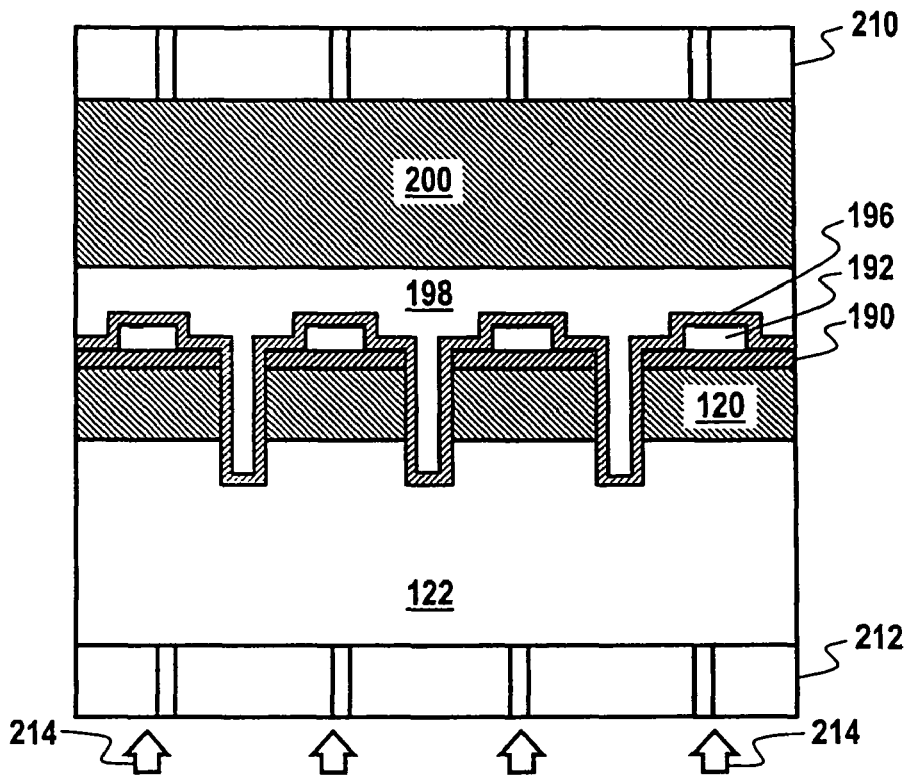
Figure 10:
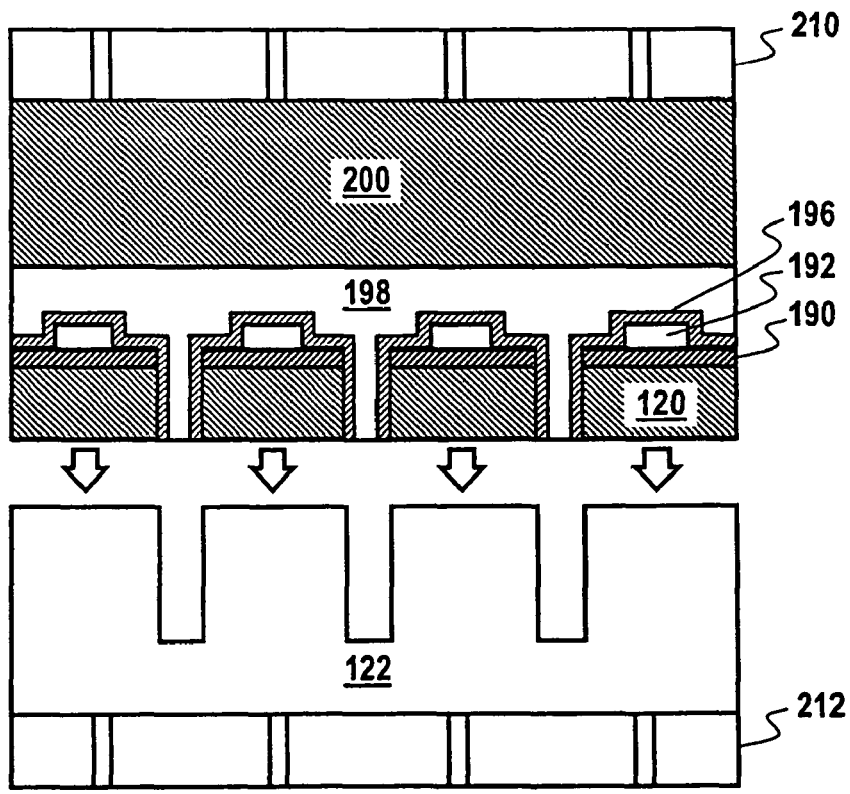

Turning now to FIG. 9, the structure shown in FIG. 8 is then attached to two vacuum chucks. A first vacuum chuck 210 attaches to the supporting wafer 200 and the second vacuum chuck 212 attaches to the sapphire substrate 122. Then, still with reference to FIG. 9, a laser beam 214 is directed through the sapphire substrate 122. The laser beam 214 is beneficially from a 248 nm KrF laser having a 3 mm×50 mm rectangular beam and beam energy between 200~600 $mJ/cm^2$. The vacuum chucks 210 and 212, which are made of materials transparent to the 248 nm KrF laser beam, beneficially sapphire, bias the sapphire substrate 122 away from the supporting wafer 200. The combination of laser irradiation and bias causes the sapphire substrate 122 to separate as shown in FIG. 10.

Similar laser lift off processes are described in U.S. Pat. No. 6,071,795 to Cheung et al., entitled, "Separation of Thin Films From Transparent Substrates By Selective Optical Processing," issued on Jun. 6, 2000, and in Kelly et al. "Optical process for liftoff of group III-nitride films," Physica Status Solidi (a) vol. 159, 1997, pp. R3-R4. Beneficially, the temporary supporting wafer 200 fully supports the individual LED semiconductor structures in the vertical topology GaN-based LED layer structure 120 in a manner the resists warping.

Figure 11:
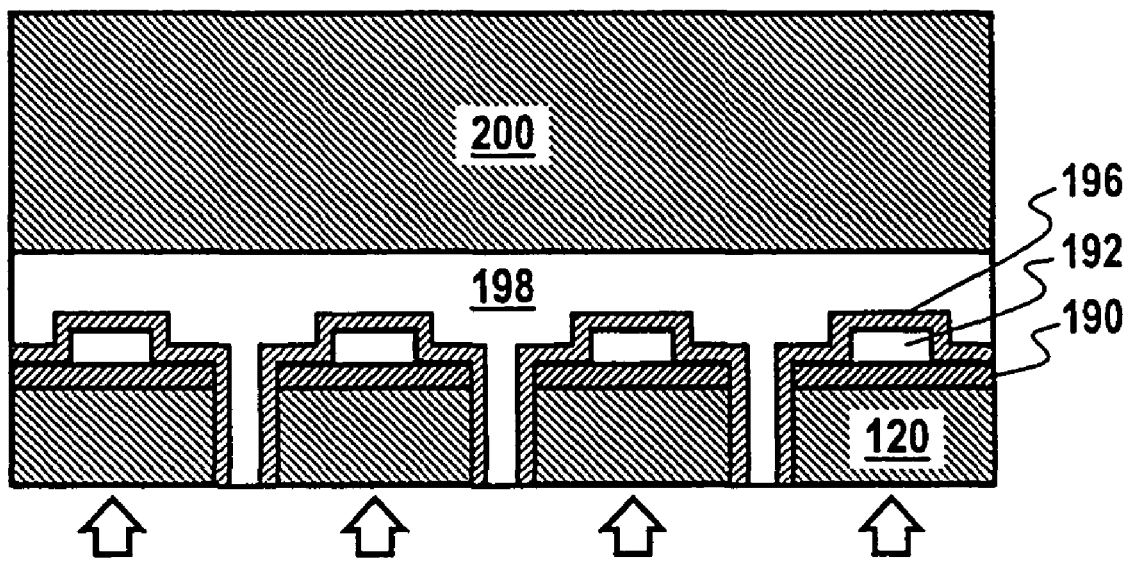

Turning now to FIG. 11, after the sapphire substrate 122 is removed, the bottom of the resulting structure (the side opposite the temporary supporting wafer 200) is first cleaned with HCl to remove Ga droplets (the laser beam 214 causes heating which separates the GaN into Ga+N). After cleaning, ICP RIE etching (see above) and polishing are performed. This etching and polishing exposes and produces an atomically flat surface of pure n-GaN. The flat surface is particularly beneficial in producing high reflectivity from a reflective structure that is deposited subsequently. Prior to reflective layer deposition, the etched n-GaN surface is further cleaned and etched with aqua regia solution (mixture of $H_2SO_4$ and HCl) to enhance the adhesion between n-GaN and Ti/Al metal layers.

Figure 12:
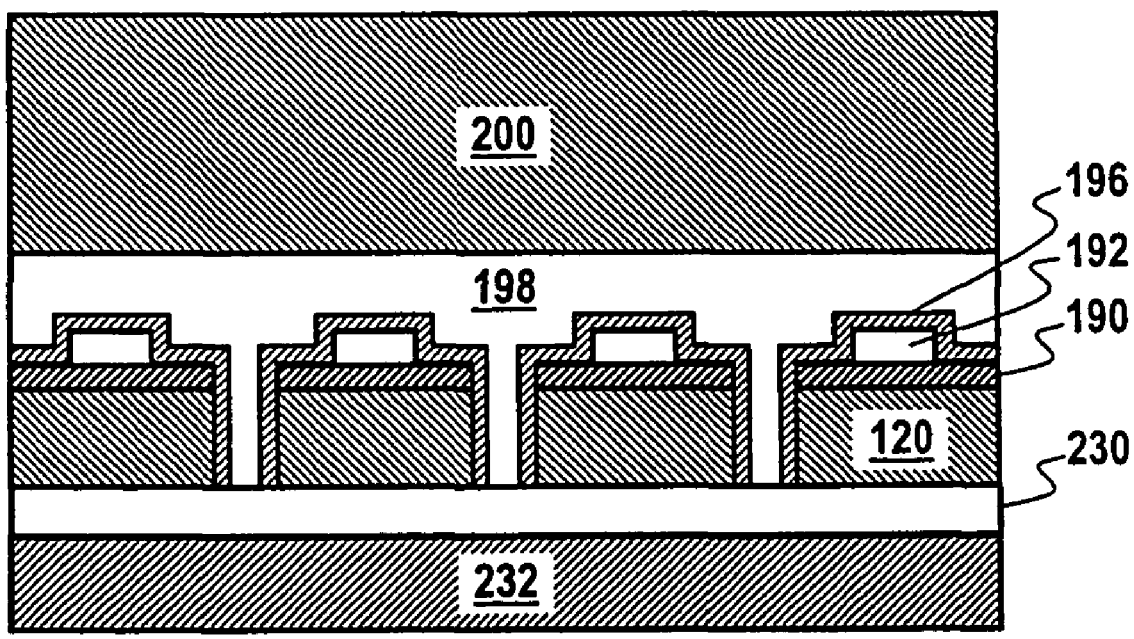

Turning to FIG. 12, a conductive reflective structure comprised of a titanium layer 230 and an aluminum layer 232 is then formed on the bottom of the structure of FIG. 11. That reflective structure will reflect light from completed LEDs that is directed toward the bottom of the LEDs back out of the top of the LEDs. These bottom metal layers also serve as an n-type contact layer for the LED device. As seen from FIG. 12, the aluminum layer 232 is relatively thicker than the titanium layer 230. As for reflectivity, the aluminum layer 232 has higher reflectivity than the titanium layer 230.

Figure 13:
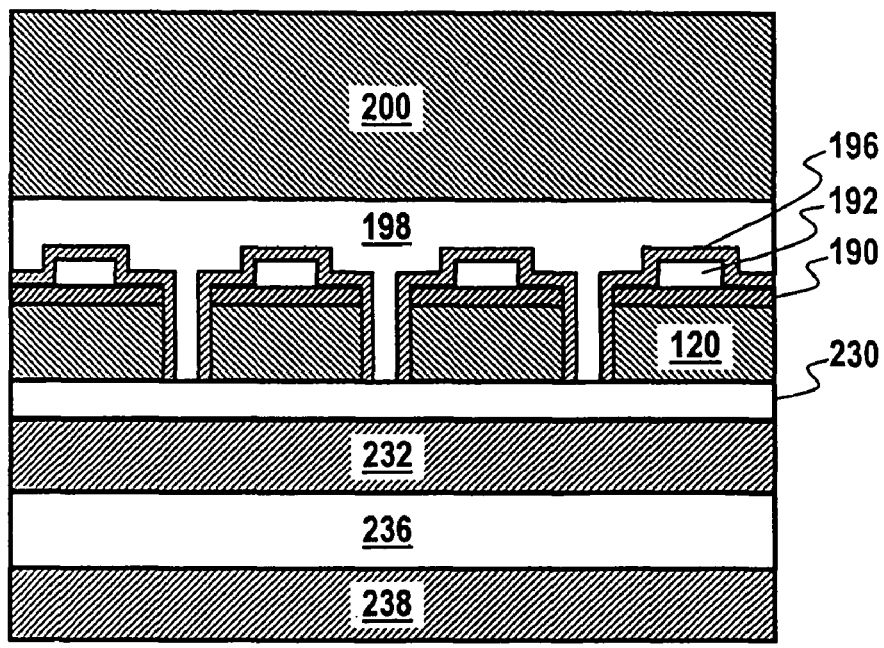

Turning now to FIG. 13, to assist formation of a subsequently produced second supporting structure, a Cr adhesion layer 236, which is less than about 30 nm thick, is formed on the Al layer 232 and an Au adhesion layer 238, which is less than about 100 nm thick, is formed on the Cr adhesion layer 236.

Figure 14:
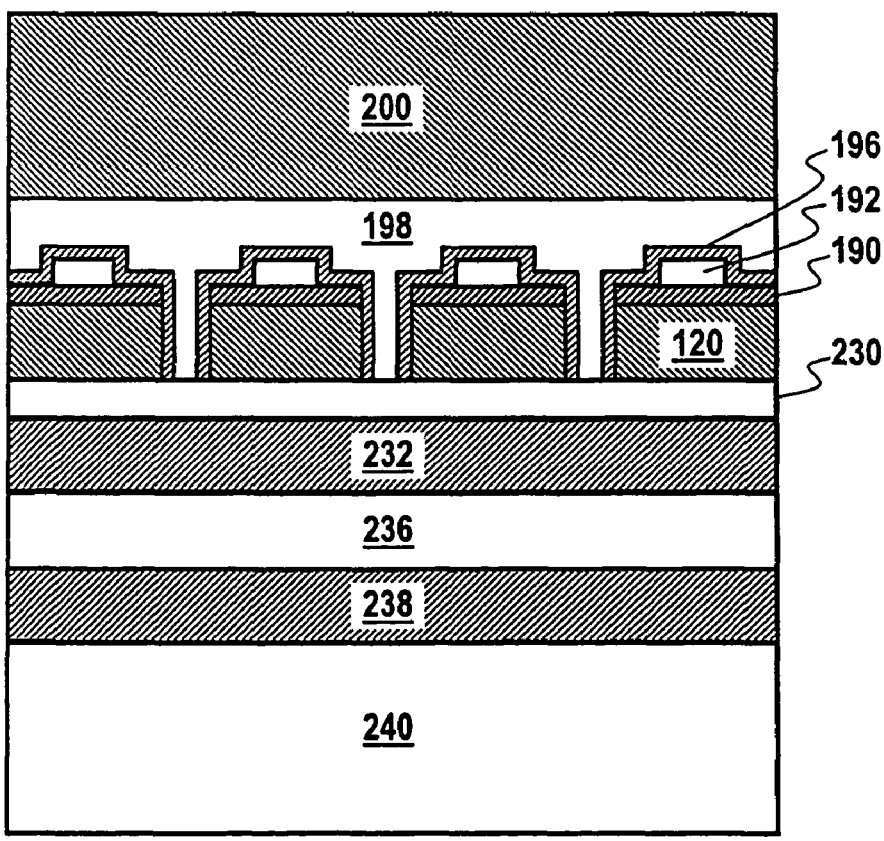

Turning now to FIG. 14, after the Au adhesion layer 238 is in place a second supporting structure in the form of a Cu, Au or Al thick film support 240 is formed on the Au adhesion layer 238. The thick film support 240 can be formed by physical vapor deposition by electroplating, by electro-less plating, or by other suitable means. This thick film support 240 is beneficially less than about 100 microns thick. While a Cu, Au or Al thick film support is beneficial, almost any electrically conductive, and beneficially thermally conductive, material is acceptable.

Figure 15:
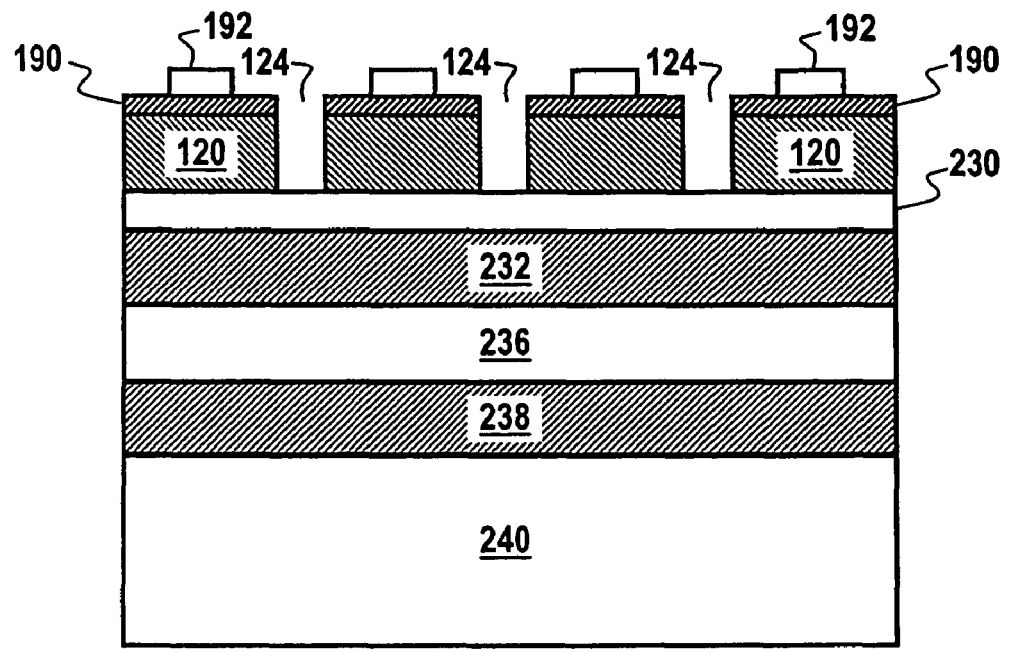

After the thick support 240 is in place, the epoxy adhesive 198 and the temporary supporting wafer 200 are removed, reference FIG. 15. Such removal is beneficially achieved by heating the structure of FIG. 14 to weaken the epoxy adhesive such that the temporary supporting wafer 200 can be removed. After the temporary supporting wafer 200 is removed the resulting structure is immersed in acetone to remove any photo-resist and residual epoxy adhesive 198.

Figure 16:
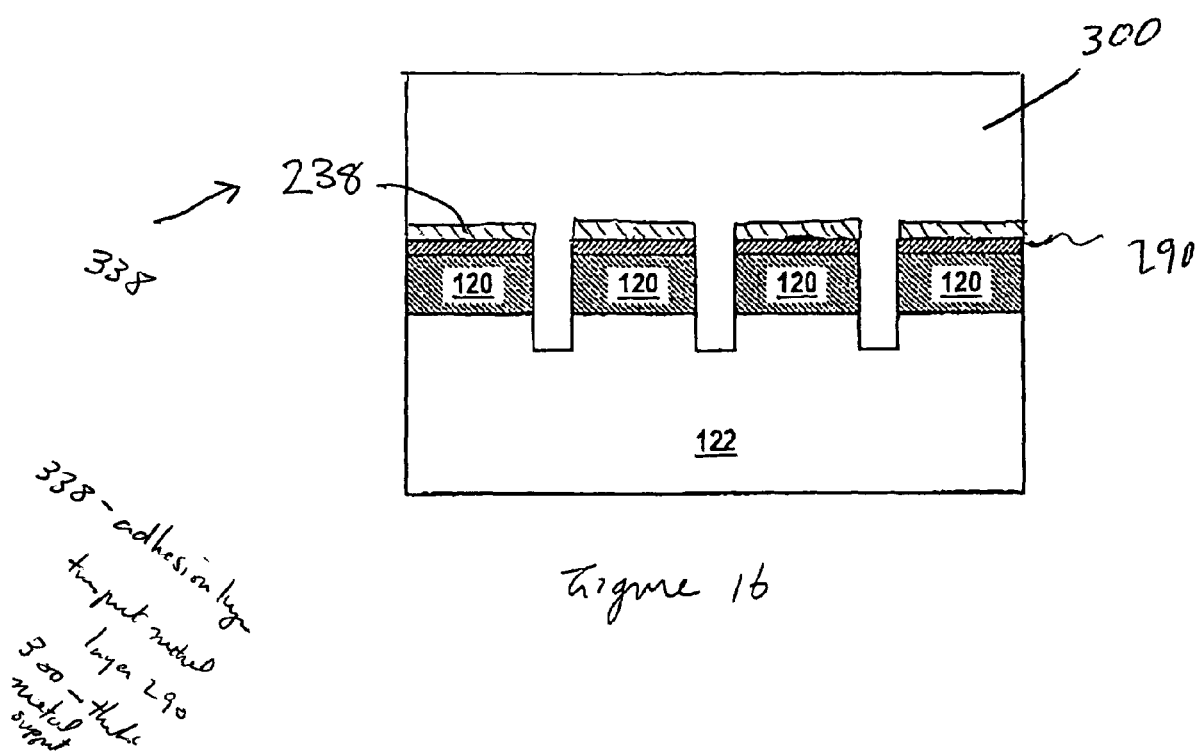

The process steps illustrated in FIGS. 6 through 15 provide for a general fabrication process that uses a temporary support structure 200. Referring now to FIG. 16, an alternative method uses a thick metal support film 300 that is formed on top of the structure of FIG. 4.

First, a transparent metal layer 290 is formed on the vertical topology GaN-based LED layer structures 120. Then, an adhesion layer 338 comprised of Cr and Au layers is located on the transparent metal layer 290. Then, the thick metal support film 300, beneficially comprised of Cu, Au or Al, is formed on the adhesion layer 338. The thick metal support film 300 can be formed by physical vapor deposition, electro/electro-less plating, or by other suitable means. This thick metal support film 300 is beneficially less than about 100 microns thick. While a Cu, Au or Al thick metal support film 300 is beneficial, almost any electrically conductive, and beneficially thermally conductive, material is acceptable.

Figure 17:
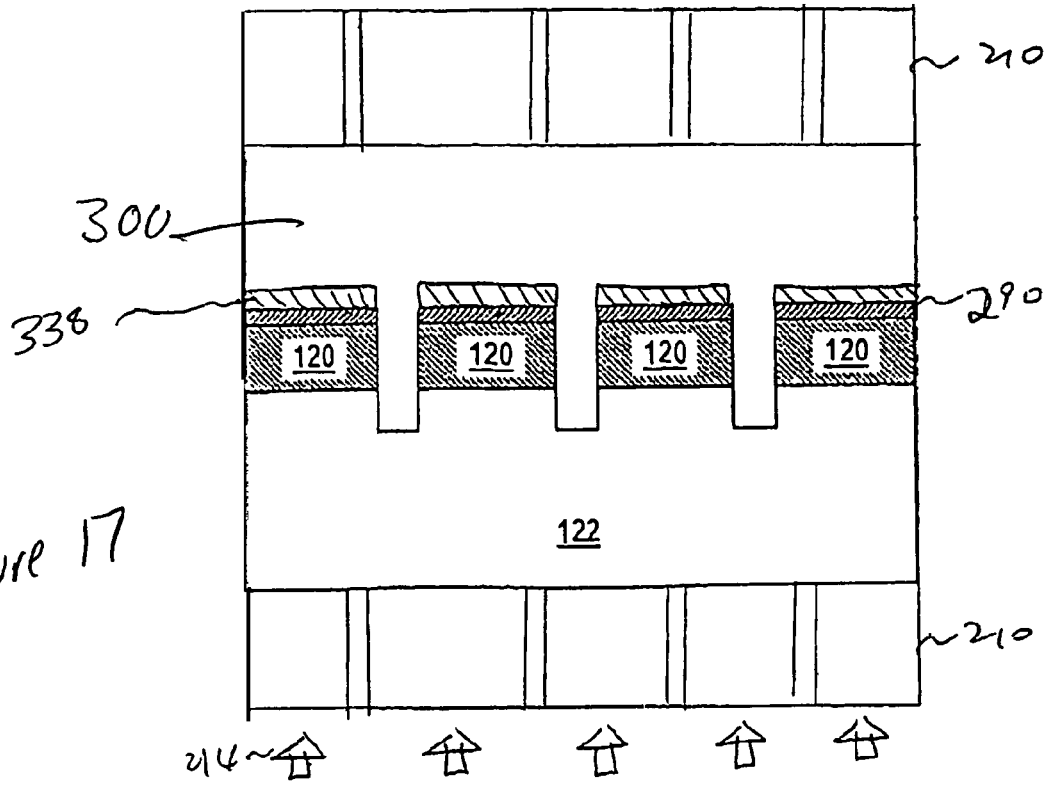
Figure 18:
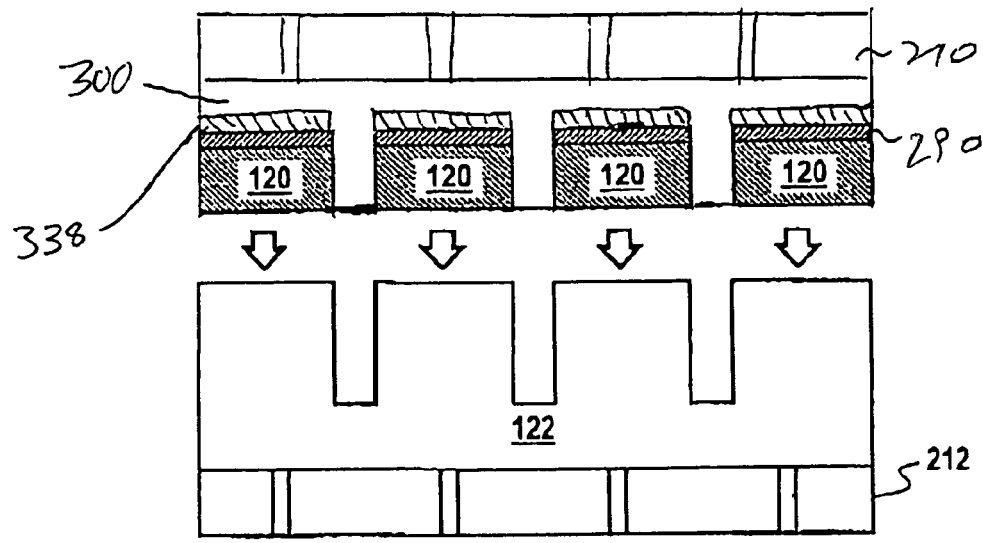

Turning now to FIG. 17, the structure shown in FIG. 16 is then attached to two vacuum chucks. A first vacuum chuck 210 attaches to the thick metal support film 300 and the second vacuum chuck 212 attaches to the sapphire substrate 122. Then, still with reference to FIG. 17, a laser beam 214 is directed through the sapphire substrate 122. The laser beam 214 is beneficially from a 248 nm KrF laser with 3 mm×50 mm rectangular beam and beam energy in between 200~600 mJ/cm2. The vacuum chucks 210 and 212, which are made of materials transparent to the 248 nm KrF laser beam, beneficially sapphire, bias the sapphire substrate 122 away from the GaN-LED devices backed with thick metal support film 300. The combination of laser irradiation and bias causes the sapphire substrate 122 to separate as shown in FIG. 18.

Similar laser lift off processes are described in U.S. Pat. No. 6,071,795 to Cheung et al., entitled, "Separation of Thin Films From Transparent Substrates By Selective Optical Processing," issued on Jun. 6, 2000, and in Kelly et al. "Optical process for liftoff of group III-nitride films," Physica Status Solidi (a) vol. 159, 1997, pp. R3-R4. Beneficially, the supporting wafer 200 fully supports the individual LED semiconductor structures in the vertical topology GaN-based LED layer structure 120.

Figure 19:
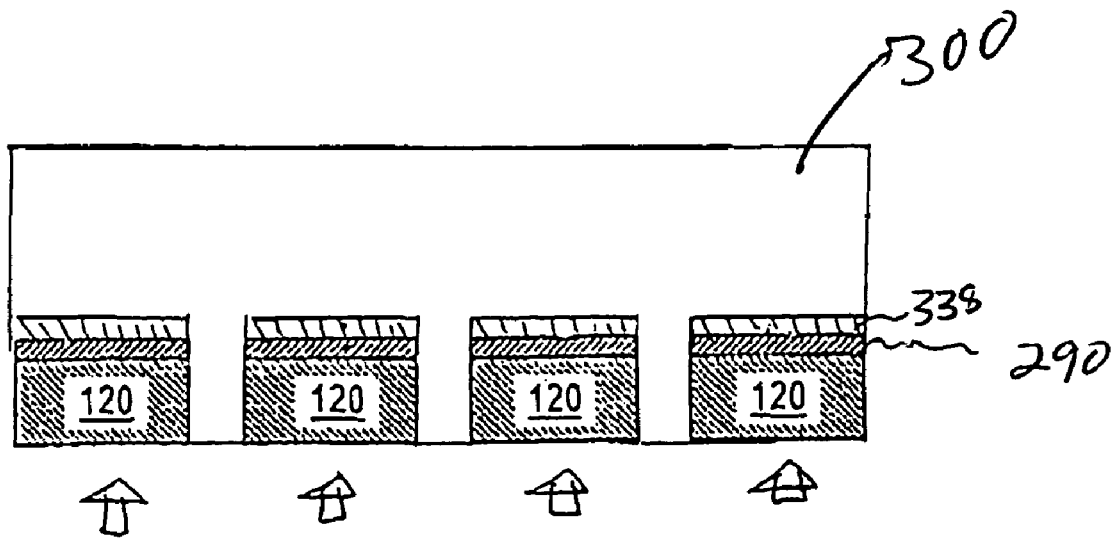

Turning now to FIG. 19, after the sapphire substrate 122 is removed; the bottom of the resulting structure (the side opposite the thick metal film 240) is first cleaned with HCl to remove Ga droplets (the laser beam 214 causes heating which separates the GaN into Ga+N). After cleaning, ICP RIE etching (see above) and polishing are performed. This etching and polishing exposes and produces an atomically flat surface of pure n-GaN. Prior to n-type contact formation, the etched n-GaN surface is further cleaned and etched with aqua regia solution (mixture of $H_2SO_4$ and HCl) to enhance the adhesion between n-GaN and Ti/Al metal layers.

Figure 20:
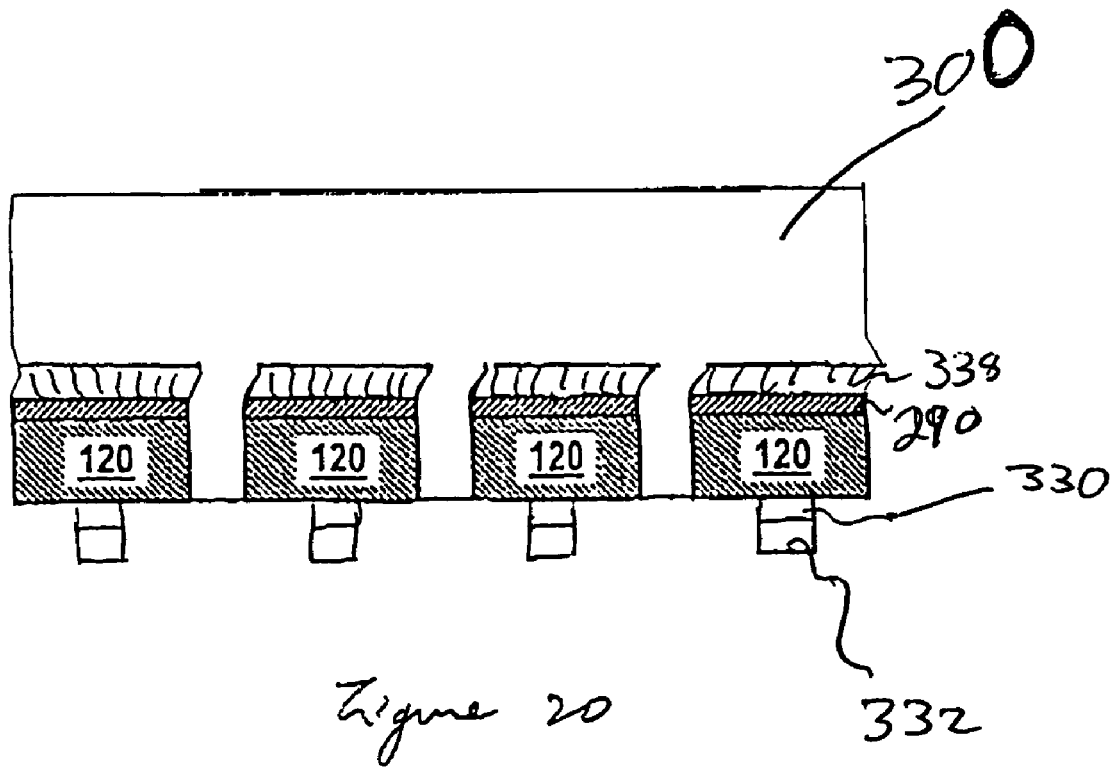

Referring now to FIG. 20, after etching and polishing exposes and produces an atomically flat surface (see FIG. 19), electrical contacts are formed on the individual vertical topology GaN-based LED layer structures 120. Those electrical contacts beneficially include a Ti/Al interface layer 330 to the vertical topology GaN-based LED layer structures 120, and a Cr/Au contact pad 332 on the Ti/Al interface layer 330.

Figure 21:
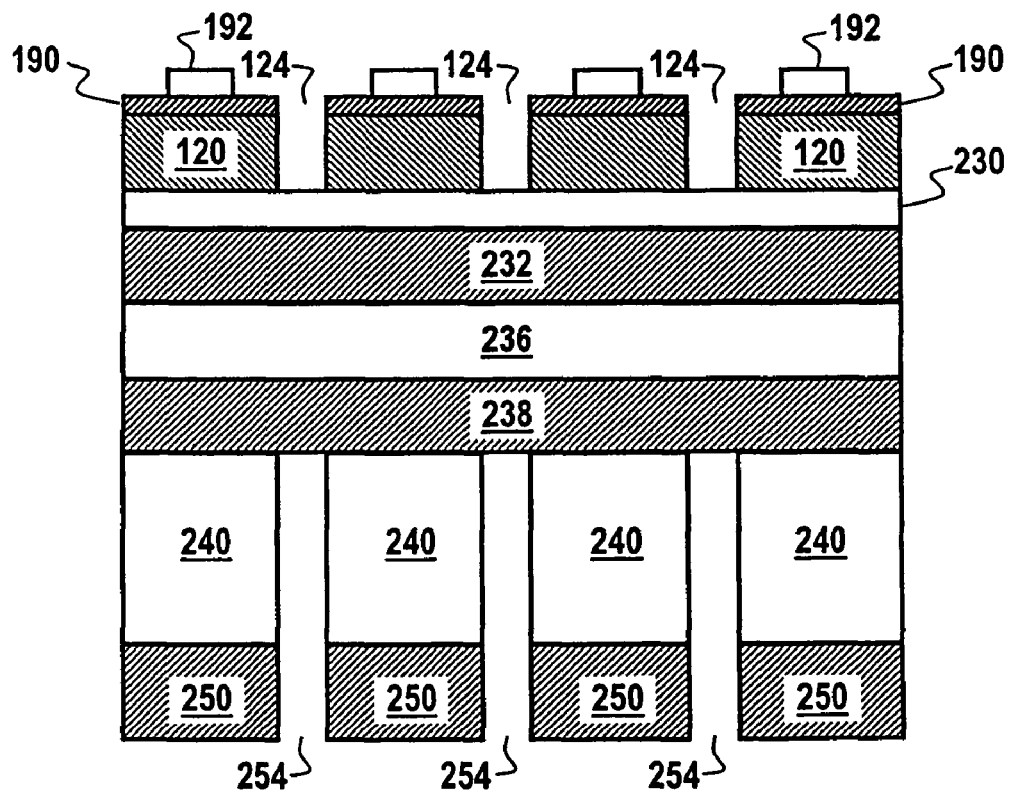

After removal of the temporary supporting wafer 200 to leave the structure shown in FIG. 15, or after formation of the Cr/Au contact layer 332 to leave the structure shown in FIG. 20, the individual LED devices are ready to be diced out. Dicing can be accomplished in many ways, for example, by chemical/electrochemical etching or by mechanical action. As the basic dicing operations are the same, dicing will be described with specific reference to the structure shown in FIG. 15, with the understanding that dicing the structure of FIG. 20 is similar. Referring now to FIG. 21, dicing is beneficially accomplished by depositing a photo-resist pattern 250 on the thick film support 240. That photo-resist pattern 250 is then developed to expose areas of the thick film support 240 that align with the trenches 124. Openings 254 are then etched through the thick film support 240. The photo-resist pattern 250 is then removed.

Figure 22:
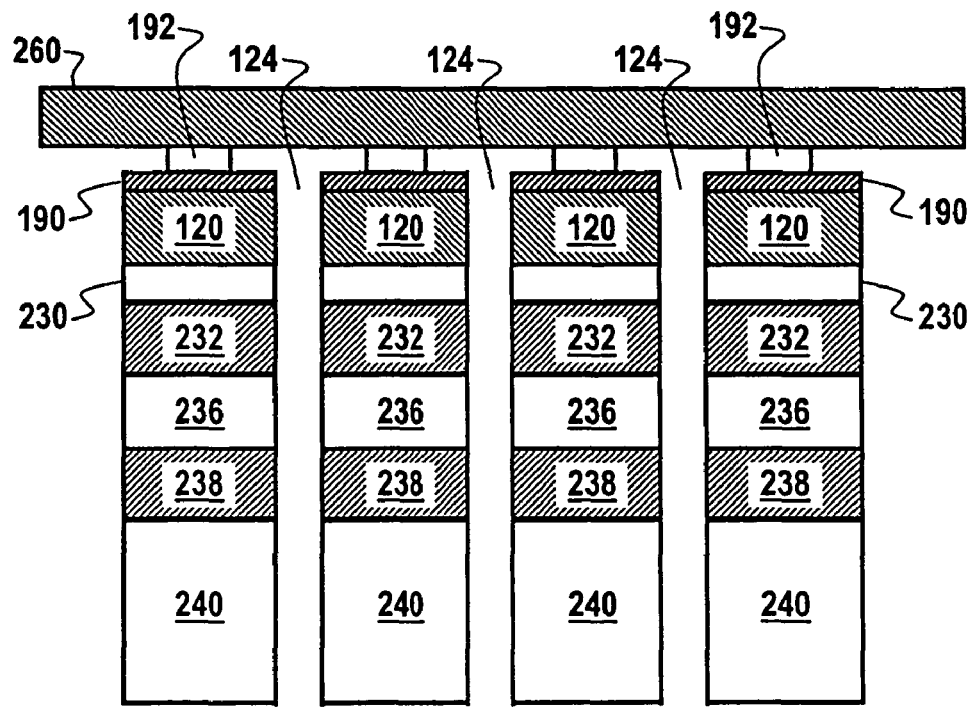
Figure 23:
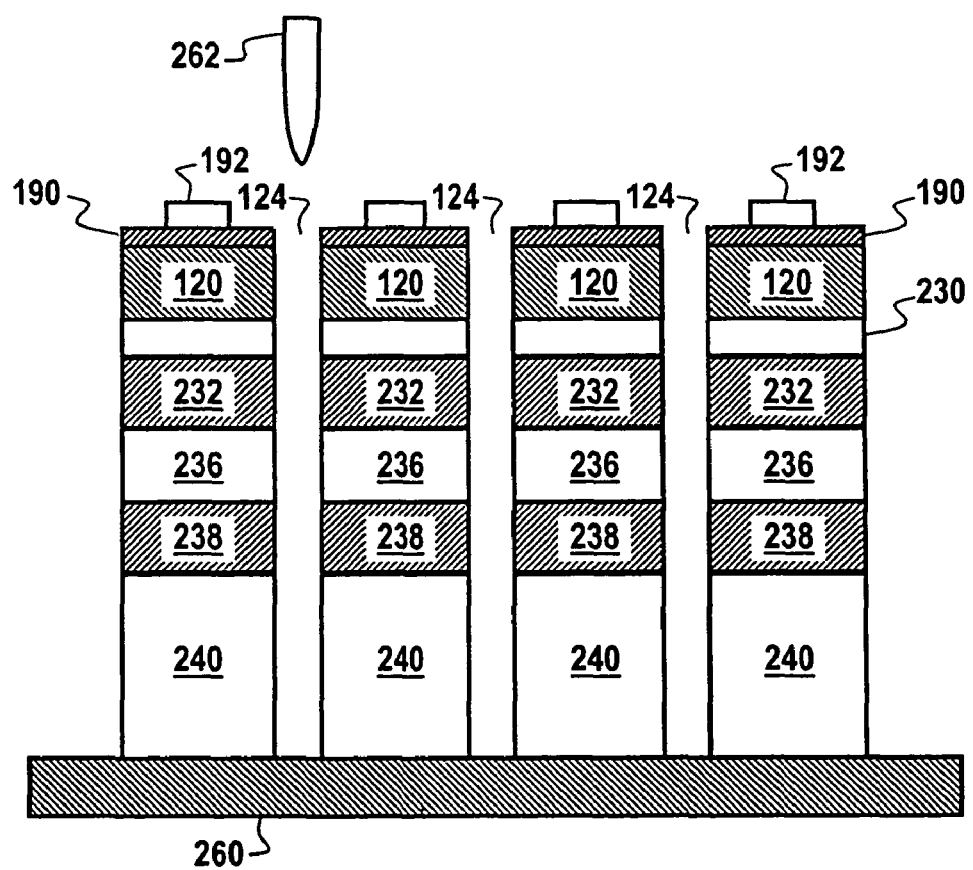

Actual separation of the individual devices can be accomplished in several ways. For example, as shown in FIG. 22, a mounting tape 260 can be placed on top of the structure of FIG. 21. Then, a roller can roll over the mounting tape to stress the remaining intact layers such that the individual devices are diced out. Alternatively, as shown in FIG. 23, the mounting tape 260 can be located on the bottom of the structure of FIG. 21. Then, a diamond-cutting wheel 262 can dice out the individual devices.

Figure 24:
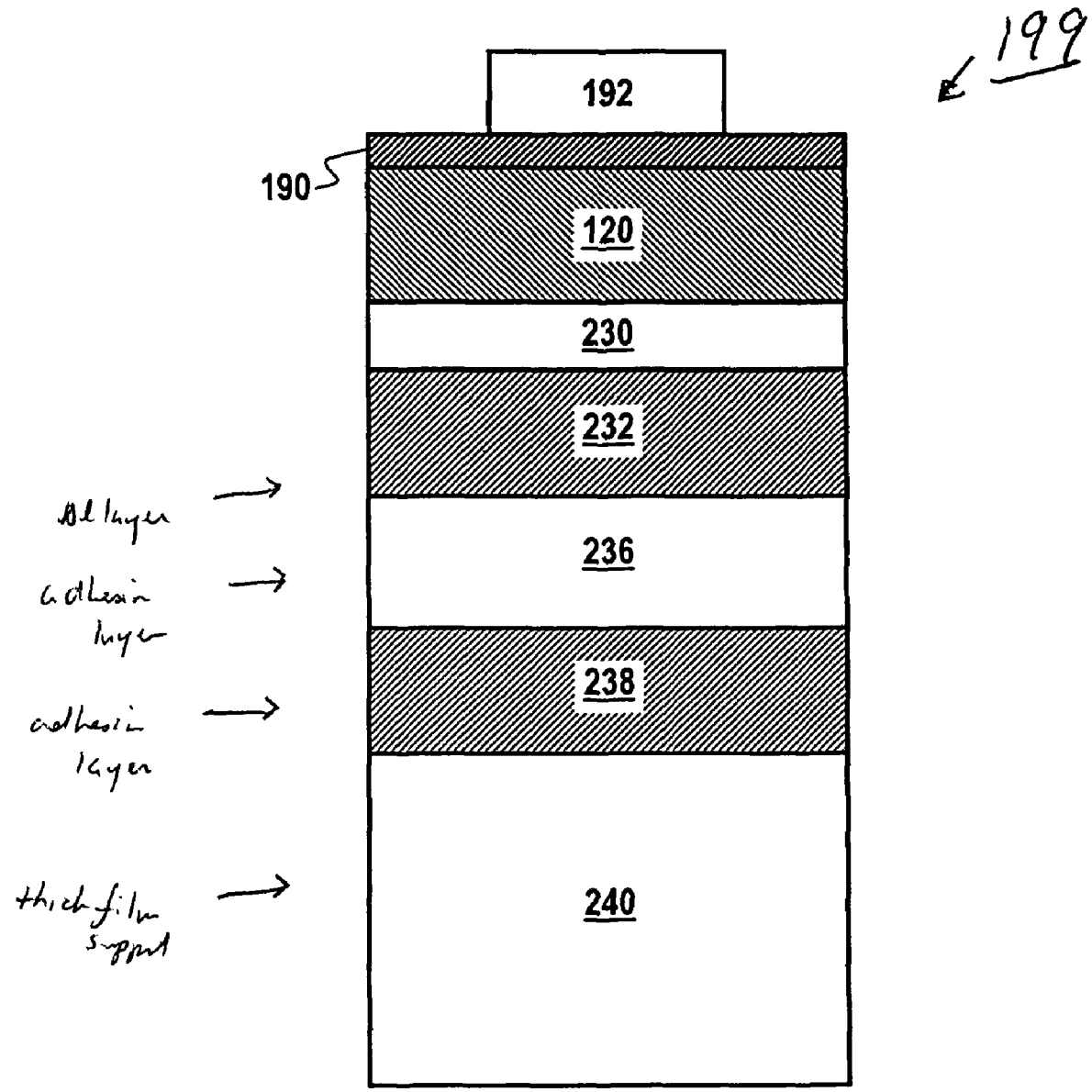

The result is a plurality of vertical topology GaN LEDs 199 on conductive substrates. As shown in FIG. 24, each LED includes a thick film support 240, an adhesion support (Cr adhesion layer 236 and Au adhesion layer 238), a reflective structure (titanium layer 230 and aluminum layer 232), semiconductor layers 120 and top contacts (transparent contact 190 and metal contact pad 192). Those semiconductor layers include semiconductor layers as shown in FIG. 2A.

Figure 25:
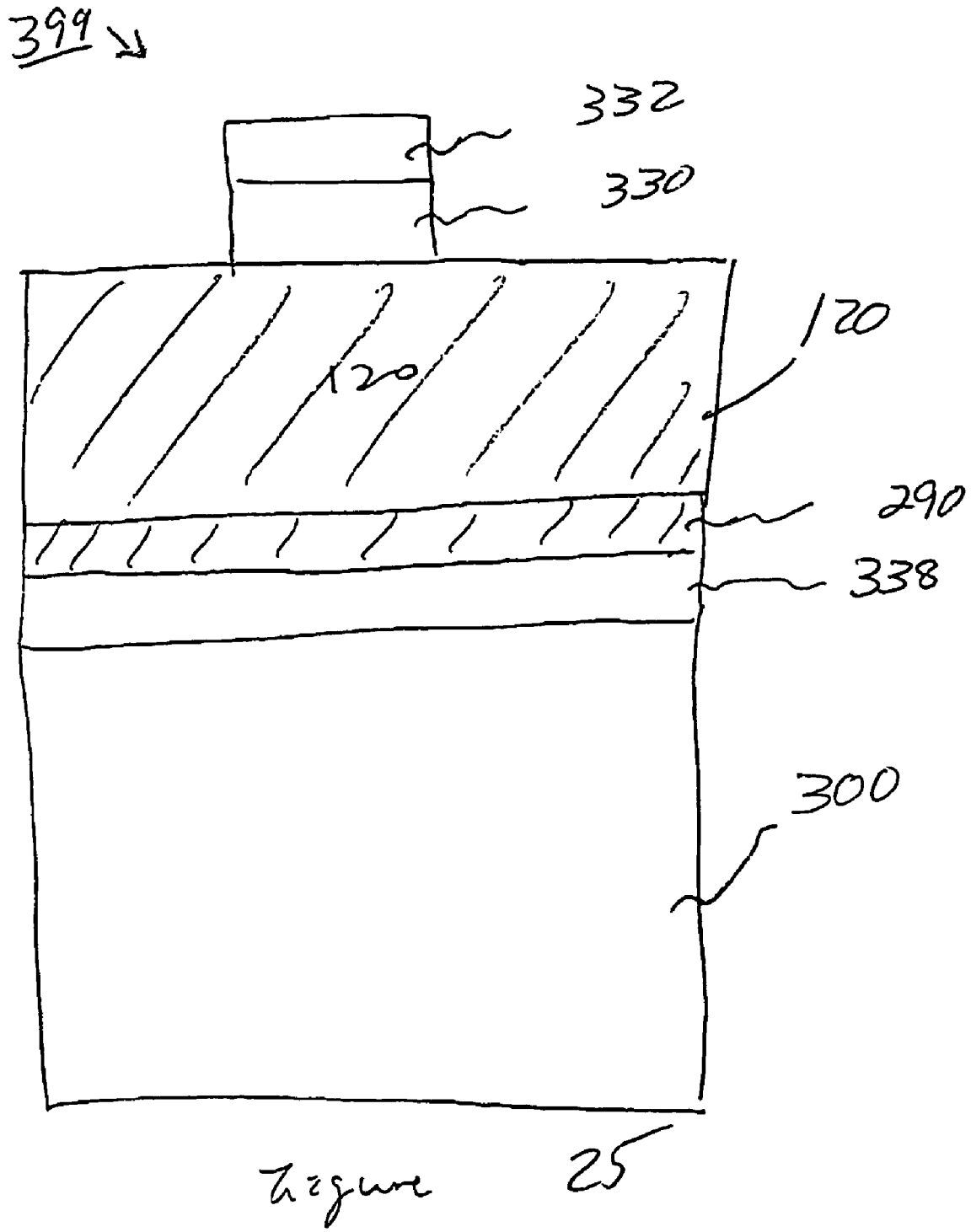

Alternatively, if a thick metal support film 300 is used, the result is the LED 399 shown in FIG. 25. That LED includes a thick metal support film 300, an adhesion layer 338, a reflective and p-type transparent contact 290, semiconductor layers 120, an n-type top interface layer 330, and a contact pad 332. Those semiconductor layers include semiconductor layers as shown in FIG. 2A.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A vertical topology light emitting device, comprising:
a conductive support structure;
a conductive adhesion structure comprising a first metallic layer on the conductive support structure and a second metallic layer, the first metallic layer being thicker than the second metallic layer, wherein the first metallic layer comprises a first metal and the second metallic layer comprises a second metal different from the first metal;
a reflective structure on the second metallic layer, the reflective structure also serving as a first electrode, wherein the reflective structure comprises a reflective metal layer and a metal contact directly on a surface of the reflective metal layer, wherein the reflective metal layer is thicker than the metal contact;
a GaN-based semiconductor layer on the metal contact, the GaN-based semiconductor layer comprising an active layer, wherein the active layer comprises InGaN;
wherein the reflective structure reflects light from the active layer, on the surface of the reflective metal layer, wherein the surface of the reflective metal layer is a dominant reflective surface,
a second electrode on a surface of the GaN-based semiconductor layer, the second electrode comprising a first layer and a second layer on the first layer; and
a metal pad on the second electrode,
wherein the reflective structure reflects light from the active layer back through the surface of the GaN-based semiconductor layer.

2. The device of claim 1, wherein the conductive support structure comprises a metallic support layer.

3. The device of claim 1, wherein the conductive support structure comprises a thermally conductive material.

4. The device of claim 1, wherein the conductive support structure comprises an electrically conductive material.

5. The device of claim 1, wherein the conductive support structure is less than about 100 microns thick.

6. The device of claim 1, wherein the conductive support structure comprises at least one of Cu, Al, or Au.

7. The device of claim 1, wherein the conductive adhesion structure comprises at least one of Au or Cr.

8. The device of claim 1, wherein the first metallic layer contacts the conductive support structure.

9. The device of claim 1, wherein the second metallic layer contacts the reflective structure.

10. The device of claim 1, wherein the first metallic layer is located, relative to the second metallic layer, proximate to the conductive support structure.

11. The device of claim 1, wherein the first metallic layer comprises Au.

12. The device of claim 1, wherein the second metallic layer comprises Cr.

13. The device of claim 1, wherein the reflective structure comprises aluminum or titanium.

14. The device of claim 1, wherein a reflectivity of the reflective metal layer is higher than a reflectivity of the metal contact.

15. The device of claim 1, wherein the shortest distance from a reflecting surface of the reflective structure to the surface of the GaN-based semiconductor layer is less than 5 microns.

16. The device of claim 1, wherein the GaN-based semiconductor layer comprises:
a first-type semiconductor layer on the metal contact; and
a second-type semiconductor layer on the first-type semiconductor layer,
wherein the active layer is located between the first-type semiconductor layer and the second-type semiconductor layer.

17. The device of claim 16, wherein the first-type semiconductor layer is n-type and the second-type semiconductor layer is p-type.

18. The device of claim 1, wherein the active layer has a composition to emit blue light.

19. The device of claim 1, wherein the second electrode comprises a second-type contact.

20. The device of claim 1, wherein the second electrode comprises a transparent contact.

21. The device of claim 20, wherein the transparent contact comprises at least one of Ru, Ni, Au, and ITO.

22. The device of claim 1, wherein the first metallic layer of the second electrode comprises Au.

23. The device of claim 1, wherein the metal pad comprises at least one of Pd, Pt, Au, and Al.

24. The device of claim 1, wherein the metal pad has a diameter of about 100 microns.

25. The device of claim 1, wherein the surface of the reflective metal layer is a dominant reflective surface with respect to a surface inside of the reflective metal layer.

* * * * *